(12) United States Patent
Yoo

(10) Patent No.: US 7,342,280 B2
(45) Date of Patent: Mar. 11, 2008

(54) NON-VOLATILE MEMORY AND METHOD OF FABRICATING THE SAME

(75) Inventor: Tae-kwang Yoo, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 380 days.

(21) Appl. No.: 11/149,396

(22) Filed: Jun. 9, 2005

(65) Prior Publication Data

US 2005/0236680 A1 Oct. 27, 2005

Related U.S. Application Data

(62) Division of application No. 10/446,970, filed on May 28, 2003, now Pat. No. 6,913,969.

(30) Foreign Application Priority Data

Jul. 9, 2002 (KR) .............................. 2002-39836

(51) Int. Cl.
*H01L 29/792* (2006.01)

(52) U.S. Cl. ...................... 257/324; 257/325

(58) Field of Classification Search ................ 257/324, 257/325, 314, 315, E29.3, E21.68, E21.18, 257/E21.422, E21.423

See application file for complete search history.

(56) References Cited

U.S. PATENT DOCUMENTS

| 6,323,107 | B1 * | 11/2001 | Ueda et al. ................. 438/435 |
| 6,380,583 | B1 * | 4/2002 | Hsieh et al. ................ 257/314 |
| 6,720,611 | B2 * | 4/2004 | Jang .......................... 257/315 |
| 7,227,219 | B2 * | 6/2007 | Mikolajick ................... 257/324 |
| 2005/0009290 | A1 * | 1/2005 | Yan et al. .................... 438/424 |
| 2006/0220088 | A1 * | 10/2006 | Ueno ......................... 257/301 |

* cited by examiner

*Primary Examiner*—Thao P. Le
(74) *Attorney, Agent, or Firm*—F. Chau & Associates, LLC.

(57) ABSTRACT

An electrically erasable programmable read-only memory (EEPROM) comprises trench isolation regions whose upper surfaces are recessed compared with an upper surface of the semiconductor substrate, thereby allowing use of all surfaces of a protrusion of the semiconductor substrate between the isolation regions, including the upper surface of the semiconductor substrate, as an active region. Accordingly, the performance of a memory cell can be improved by increasing the size of an active channel region without needing to change the size of a planar unit cell.

14 Claims, 4 Drawing Sheets

NON-VOLATILE MEMORY AND METHOD OF FABRICATING THE SAME

CROSS-REFERENCE TO RELATED APPLICATION

This application is a divisional of U.S. application Ser. No. 10/446,970 filed on May 28, 2003, now U.S. Pat. No. 6,913,969 the disclosure of which is herein incorporated by reference in its entirety.

BACKGROUND OF THE INVENTION

This application claims priority to Korean Patent Application No. 2002-39836, filed Jul. 9, 2002, which is herein incorporated by reference in its entirety.

1. Field of the Invention

The present invention relates to a non-volatile memory device in which stored data is maintained without a power supply and a method of fabricating the same, and more particularly, to an electrically erasable programmable read-only memory (hereinafter, referred to as 'EEPROM') and a method of fabricating the same.

2. Description of the Related Art

Electrically erasable programmable non-volatile memory comes in different types, for example, EEPROM of a floating gate type, a metal-nitride-oxide-silicon (MNOS) type, a metal-oxide-nitride-oxide-silicon (MONOS) type, and a silicon-oxide-nitride-oxide-silicon (SONOS) type.

An example of a SONOS-type EEPROM is illustrated in FIGS. 1 and 2. FIGS. 1 and 2 are cross-sectional views of the SONOS-type EEPROM, shown along a bit line and a gate, respectively.

Referring to FIGS. 1 and 2, the SONOS-type EEPROM has a stacked structure comprising a lower oxide layer 20, a nitride layer 30, an upper oxide layer 40, and a polysilicon layer 50. The lower oxide layer 20 is a tunnel oxide layer, the nitride layer 30 is a memory (storage) layer, and the upper oxide layer 40 is a blocking layer for preventing the loss of a stored charge. The polysilicon layer 50 is a gate. The lower oxide layer 20, the nitride layer 30, the upper oxide layer 40, and the polysilicon layer 50 are sequentially formed on a substrate 10 in which isolation regions 15 are formed. Source/drain regions 60 are formed at both sides of the stacked structure in the substrate 10.

The SONOS-type EEPROM can be used in a compact semiconductor memory cell because it needs less voltage to program and erase than an EEPROM of the floating gate type. To achieve a more highly integrated SONOS-type EEPROM, the size of a memory cell needs to be reduced. As the size of the SONOS-type EEPROM is reduced, isolation of each memory cell becomes more important. Thus, an area for isolation of each cell needs to be secured. The size of the area of isolation limits the size of an active area in this case.

Therefore, a need exists for a memory cell having an enhanced active channel region without increasing the size of a planar unit cell, and a method for fabricating the same.

SUMMARY OF THE INVENTION

To solve the above problems, the present invention provides an EEPROM that can be more highly integrated than conventional EEPROMs.

According to an embodiment of the present invention, a method of fabricating a SONOS-type EEPROM increases memory cell performance and reduces memory cell size.

According to an embodiment of the present invention, an EEPROM comprises trench isolation regions being recessed compared to an upper surface of a semiconductor substrate, and a tunnel oxide layer formed on the trench isolation regions and a protrusion of the semiconductor substrate between the trench isolation regions. The EEPROM further comprises a nitride layer formed on the tunnel oxide layer, a blocking oxide layer formed on the nitride layer, and a polysilicon gate conductive layer formed on the blocking oxide layer.

Portions of an interface between the polysilicon gate conductive layer and the blocking oxide layer above the isolation regions are lower than the upper surface of the semiconductor substrate. Preferably, edges of the protrusion of the semiconductor substrate are rounded.

A SONOS-type EEPROM according to the present invention comprises an active region, which has a 2D layout substantially similar to a conventional SONOS-type EEPROM, and a 3D structure, which increases an effective channel width of the active area. The active region, according to an embodiment of the present invention, comprises both an upper surface and sidewalls of a protrusion of semiconductor substrate between the isolation regions.

According to another embodiment of the present invention, a method of fabricating an EEPROM comprises defining an active region and an inactive region on the semiconductor substrate, and forming trench isolation regions in the inactive region to increase an area of the active region from the upper surface of a protrusion of the semiconductor substrate between the isolation regions to a side of the protrusion, the upper surfaces of the trench isolation regions being lower than an upper surface of the semiconductor substrate. The method further comprises forming a tunnel oxide layer on the isolation regions and the protrusion of the semiconductor substrate, and sequentially forming a nitride layer, a blocking oxide layer, and a polysilicon gate conductive layer on the tunnel oxide layer.

The surfaces of the trench isolation regions are at the same level as the surface of the semiconductor substrate. The trench isolation regions are formed in the inactive region, and the isolation regions are etched to a predetermined thickness so as to form recessed trench isolation regions. The isolation regions may be etched by wet etch back using HF.

It is preferable that the method further comprises rounding angular edges of the protrusion after increasing the area of the active region. To round the angular edges, the angular edges of the protrusion are etched using a mixture of $NH_4OH$, $H_2O_2$, and $H_2O$, or are oxidized, wherein oxidized portions of the edges are removed.

The tunnel oxide layer is obtained by forming an oxide layer using low-pressure chemical vapor deposition (LPCVD), and annealing the oxide layer, wherein the annealing process is performed at an atmosphere containing $N_2O$, NO, or a mixture of $N_2O$ and NO.

A SONOS-type EEPROM according to an embodiment of the present invention comprises an active region, which has a substantially similar 2D layout as an active region of a conventional SONOS-type EEPROM, but comprises a 3D structure, thereby increasing an effective channel width of the active region. That is, an upper surface of a semiconductor substrate and the sidewalls of a protrusion of the semiconductor substrate between isolation regions are used as an active region. The storage node of a nitride layer is also formed along sidewalls of the active region of the SONOS-type EEPROM, as well as the upper surface of the active region, and thus effective channel width is increased.

Accordingly, it is possible to increase the efficiency of programming the memory or erasing information stored in the memory, while reducing the amount of cell current needed for erasing the memory.

BRIEF DESCRIPTION OF THE DRAWINGS

The above features and advantages of the present invention will become more apparent by describing in detail preferred embodiments thereof with reference to the attached drawings in which.

DETAILED DESCRIPTION OF PREFERRED EMBODIMENTS

Figure 1:
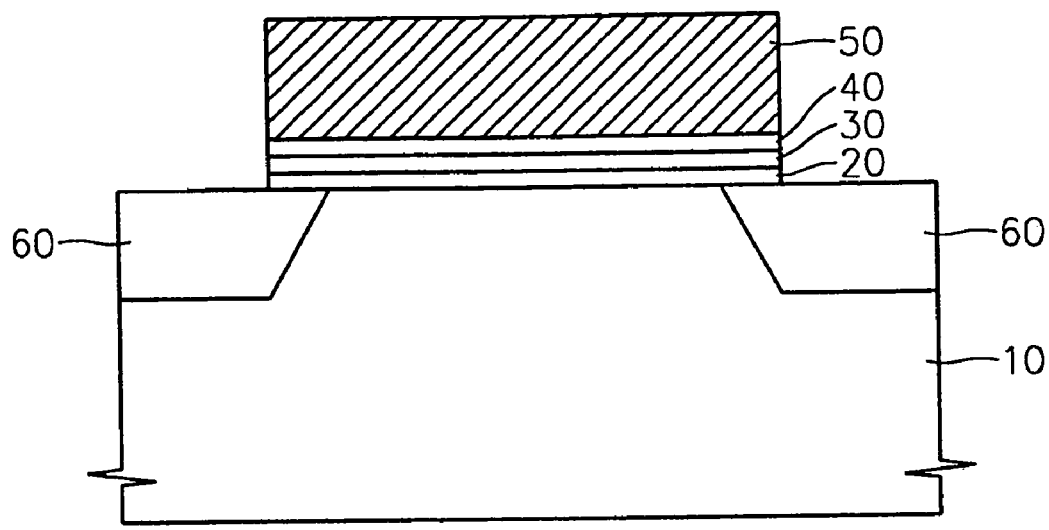
FIGS. 1 and 2 are cross-sectional views of a conventional SONOS-type EEPROM.
Figure 2:
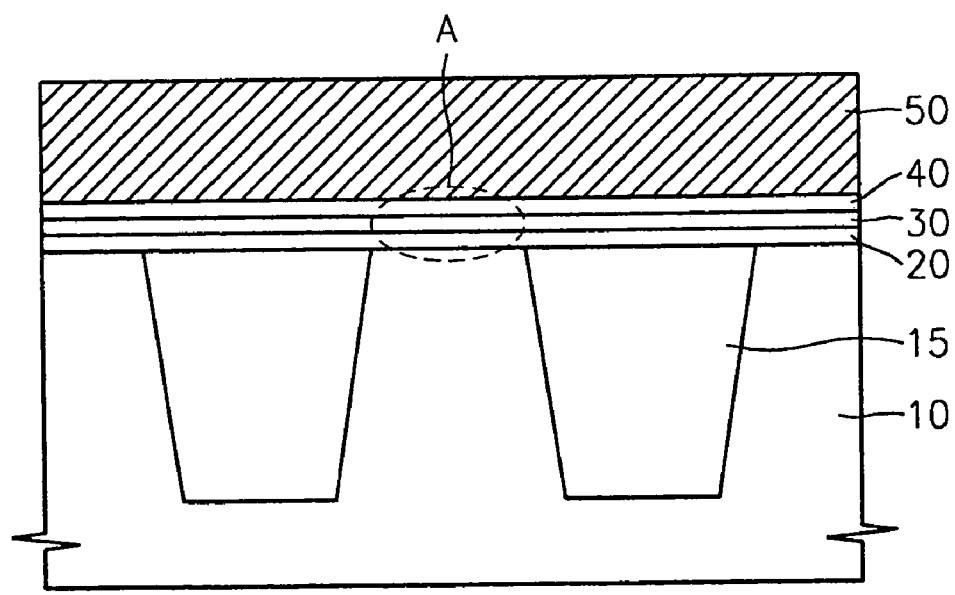

The present invention will now be described more fully with reference to the accompanying drawings, in which preferred embodiments of the invention are shown. This invention may be embodied in different forms and should not be construed as being limited to the embodiments set forth herein. Rather, these embodiments are provided so that this disclosure will be thorough and complete and will fully convey the concept of the invention to those skilled in the art. Characteristics, such as shape and thickness, of elements shown in the drawings may be exaggerated for clarity. The same reference numerals in different drawings represent the same elements, and thus their descriptions will not be repeated.

FIGS. 3 through 6 are cross-sectional views illustrating a method of fabricating a SONOS-type EEPROM according to an embodiment of the present invention. The cross-sectional views of the EEPROM are shown along the direction of a gate.

Figure 3:
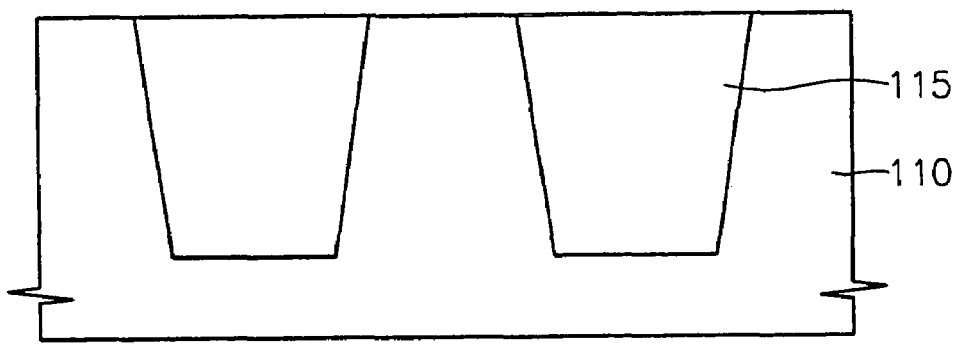
FIGS. 3 through 6 are cross-sectional views illustrating a method of fabricating a SONOS-type EEPROM according to an embodiment of the present invention.

Referring to FIG. 3, a semiconductor substrate 110 is provided, in which a well (not shown) may be formed using ion implantation. Shallow trench isolation (STI) regions 115 are formed in the semiconductor substrate 110 to define active regions and inactive regions. The STI regions 115 are formed in the inactive regions of the semiconductor substrate 110 and are level with the upper surface of the semiconductor substrate 110.

To fabricate the STI regions 115, oxide and nitride layers are formed on the semiconductor substrate 110. The oxide and nitride layers are patterned to form openings where trenches are to be formed. The trenches are formed to a depth of about 3000-6000 Å in the semiconductor substrate 110 with the patterned oxide and nitride layers being used as masks. Insulating layers are formed to fill the trenches. For example, the trenches may be filled with insulating layers in the manner where (i) an oxide liner and/or a nitride liner is formed along the inner walls of the trenches; (ii) a middle-temperature oxide (MTO) is formed on the liner; and (iii) a remaining portion of the trenches is filled with a material having excellent gap filling characteristics, e.g., undoped silicate glass (USG) or an oxide layer that is obtained using high-density plasma chemical vapor deposition (HDP CVD). After the trenches are filled, the upper surfaces of the insulating layers are planarized using chemical mechanical polishing (CMP) or an etch back method. During planarization, the patterned nitride layer acts as a stop for the CMP or the etch back method. The patterned oxide and nitride layers left on the semiconductor substrate 110 are removed to obtain the STI regions 115 whose upper surfaces are at the same height as, or slightly higher than, that of the semiconductor substrate 110.

Figure 4:
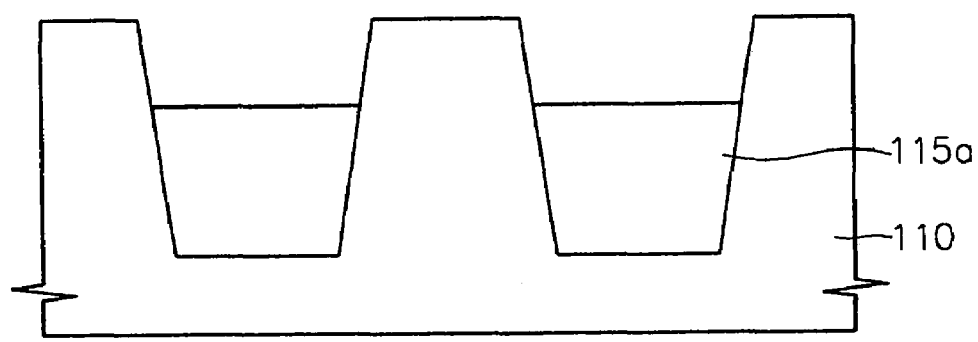

Referring to FIG. 4, the STI regions 115 are etched to a predetermined thickness forming recessed trench isolation regions 115a, whose upper surfaces are lower than the upper surface of the semiconductor substrate 110. A protrusion of the semiconductor substrate 110 between the trench isolation regions 115a forms an active region. The active area comprises the top and the sidewalls of the protrusion. Thus, according to the present invention, it is possible to increase the size of the active region without changing the two-dimensional layout of the active region.

The STI region 115 may be etched with a hydrofluoric acid (HF) solution using wet etch back. The HF solution is obtained by mixing HF with $H_2O$ at a ratio of between about 1:10 and 1:1000 at room temperature. The STI regions 115 are dipped in the HF solution or the HF solution may be sprayed onto the STI regions 115 so as to etch the STI regions 115 to the predetermined thickness. Alternatively, a buffered oxide etchant (BOE), which is a mixture of HF and $NH_4F$, may be used in stead of the HF solution. The isolation regions 115a of a desired thickness can be obtained by appropriately increasing or reducing the time spent dipping the STI regions 115 in the HF solution or BOE or spraying the HF solution or BOE onto the STI regions 115.

Accordingly, the active region protrudes above the semiconductor substrate 110 and allows effective isolation of devices even if the isolation regions 115a are thinner than a conventional field oxide layer. The thickness of the isolation region 115a can be increased if needed, given a recess of a certain depth, by increasing the depth of the trenches.

Figure 5:
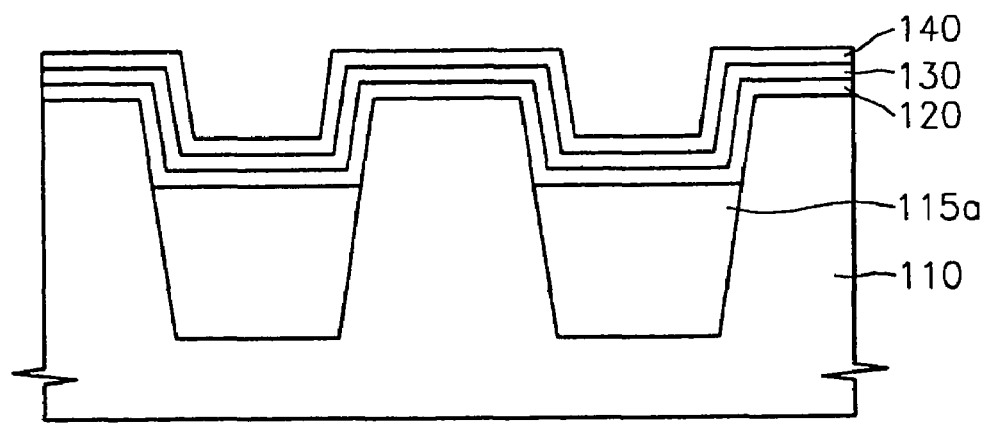

Referring to FIG. 5, a tunnel oxide layer 120 is formed to completely cover the isolation region 115a and the protrusion of the semiconductor substrate 110. The tunnel oxide layer 120 is formed by thermally oxidizing the resultant structure of FIG. 4. Alternatively, the tunnel oxide layer 120 may be obtained by depositing a MTO on the resultant structure of FIG. 4 using low-pressure CVD (LPCVD) and annealing the MTO. The annealing process is performed in a gas atmosphere comprising $N_2O$ and/or NO. However, for the as deposited MTO, there is a higher probability of surface defects such as silicon dangling bonds. Performing the annealing process under an atmosphere of $N_2O$ and/or NO removes such defects, thus improving the leakage current characteristics and the reliability of the MTO.

After the formation of the tunnel oxide layer 120, a nitride layer 130, which acts as a memory (storage) layer, is formed on the tunnel oxide layer 120. The nitride layer 130 may be formed by nitrifying the tunnel oxide layer 120 or using LPCVD. A blocking oxide layer 140 is formed on the nitride layer 130 to prevent loss of stored charges. The blocking oxide layer 140 may be formed by thermally oxidizing the nitride layer 130.

Figure 6:
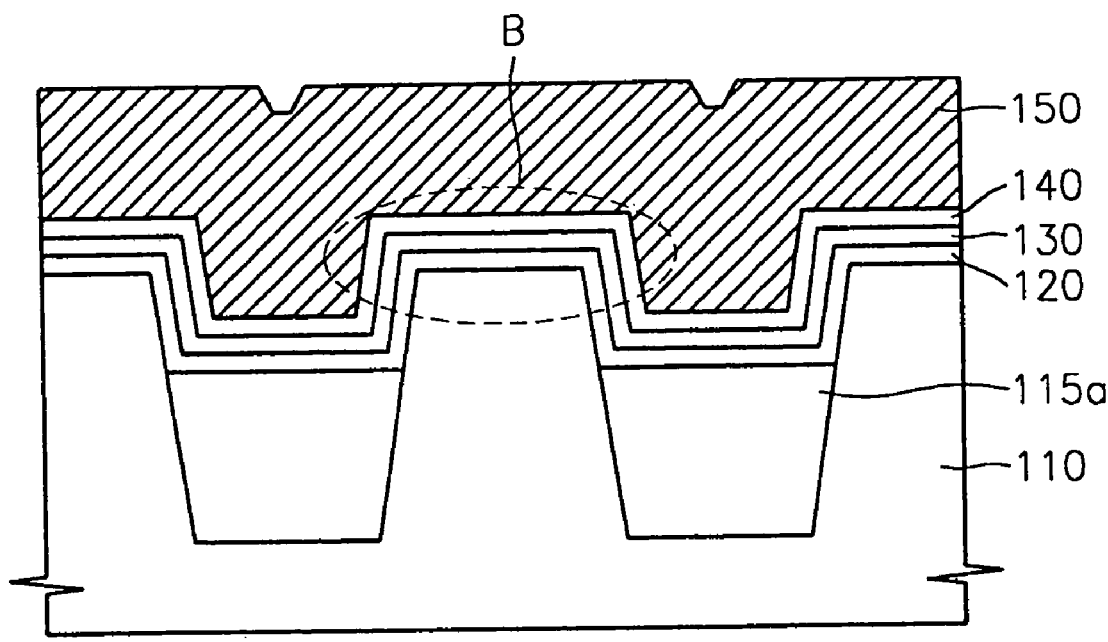

Referring to FIG. 6, a polyslicon gate conductive layer 150 is formed on the blocking oxide layer 140. The interface between the polysilicon gate conductive layer 150 and the blocking oxide layer 140, above each of the isolation regions 115a, is lower than the upper surface of the semiconductor substrate 110. Deposition of the polysilicon gate conductive layer 150 may be performed at temperature of about 500-700° C. using LPCVD. The polysilicon gate conductive layer 150 may be formed by first depositing a polysilicon layer, which is not doped with impurities, on the resultant structure of FIG. 5 and ion-implanting arsenic (Ar) or phosphorous (P) into the polysilicon layer so as to make the polysilicon layer conductive. Alternatively, the polysilicon gate conductive layer 150 may be made by doping polysilicon with impurities and depositing the impurity-doped polysilicon on the blocking oxide layer 140 by using an in-situ process.

As shown in FIG. 6, an EEPROM according to an embodiment of the present invention comprises the isolation regions 115*a* that are formed lower than the upper surface of the semiconductor substrate 110, the tunnel oxide layer 120 covering the upper surfaces of the isolation regions 115*a* and the semiconductor substrate 110 that protrudes between the upper surfaces of the isolation regions 115*a*, the nitride layer 130 formed on the tunnel oxide layer 120, the blocking oxide layer 140 formed on the nitride layer 130, and the polysilicon gate conductive layer 150 formed on the blocking oxide layer 140. The interface between the polysilicon gate conductive layer 150 and the blocking oxide layer 140, above the isolation regions 115*a*, is lower than the upper surface of the semiconductor substrate 110.

A SONOS-type EEPROM according to an embodiment of the present invention comprises an active region, which has a 2D layout substantially similar to a conventional SONOS-type EEPROM and a 3D structure, which increases an effective channel width of the active area. The active region comprises both the upper surface and the sidewalls of a protrusion of the semiconductor substrate 110 between the isolation regions 115*a*.

Figure 7:
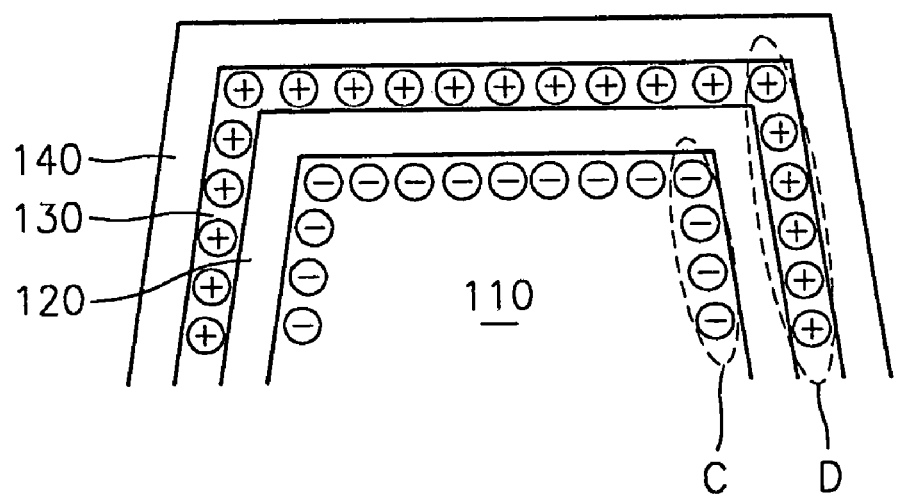
FIG. 7 is a magnified view of a portion B shown in FIG. 6.

FIG. 7 is a magnified view of the region B of FIG. 6. Referring to FIG. 7, additional storage capacity D is realized along the sidewalls of a protrusion of the semiconductor substrate 110, thereby increasing the effective width of the active region without changing the cell layout. The formation of the additional storage facilities D results in the formation of an additional channel C along a portion of the semiconductor substrate 110. As a result, it is possible to enhance the programming and erasing efficiencies, and reduce the amount of cell current needed when reading information stored in the memory cell. Due to an increase in the performance of the memory cell, the memory cell can be made smaller, while achieving at least the same level of performance as compared to a larger conventional memory cell, thereby increasing the integration of the memory. An active region of an EEPROM according to the present invention is a three-dimensional (3D) region having more area than a planar active region of a conventional EEPROM having a substantially similar 2D layout. Accordingly, a high-density and highly integrated EEPROM can be fabricated in which devices are effectively separated from one another.

Figure 8:
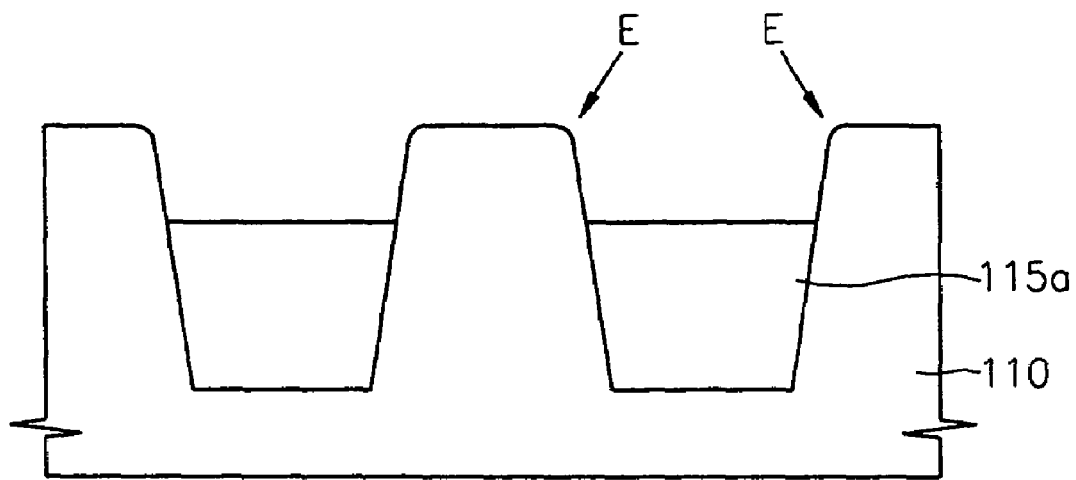
FIGS. 8 and 9 are cross-sectional views illustrating a method of fabricating a SONOS-type EEPROM according to another embodiment of the present invention.
Figure 9:
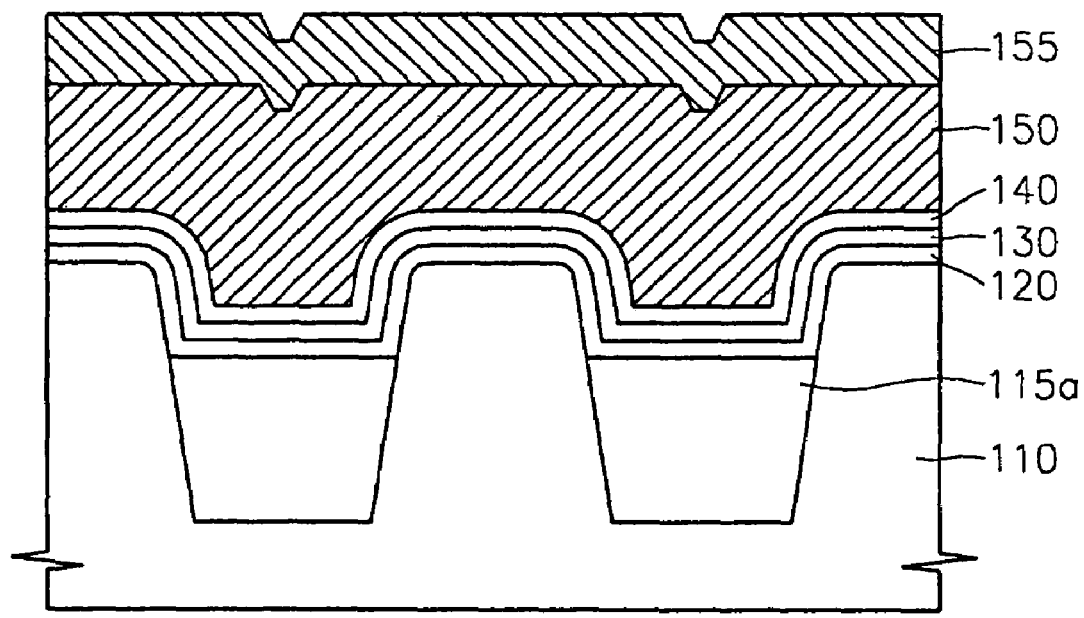

FIGS. 8 and 9 are cross-sectional views illustrating a method of fabricating a SONOS-type EEPROM according to an embodiment of the present invention.

Referring to FIG. 8, from the structure shown in FIG. 4, edge portions of a semiconductor substrate 110, which protrude above isolation regions 115*a*, are rounded to form round edges E.

The round edges E may be formed by etching the edge portions using a mixture of $NH_4OH$, $H_2O_2$, and $H_2O$. Angular edges are etched at a higher rate by this mixture than round portions, and thus the angular edges become rounded without substantially affecting other structures. $NH_4OH$, $H_2O_2$, and $H_2O$ may be mixed at a ratio between about 1:1:5 and 1:4:100 at a temperature of about 50-75° C. to form the mixture.

Alternatively, the round edges E may be made by oxidizing the angular edges and removing the oxidized portions of the edges. The structure of FIG. 4 is exposed to an atmosphere comprising oxygen to oxidize the exposed portions of the semiconductor substrate 110. In particular, the angular edges are easily oxidized as compared to other structures. An oxide layer covering the angular edges forms a round interface with the semiconductor substrate 110. The oxide layer on the edges is wet-etched using an HF solution and removed to expose round edges E.

Referring to FIG. 9, a tunnel oxide layer 120 is formed to cover the isolation regions 115*a* and the protrusion of the semiconductor substrate 110 between the isolation regions 115*a*. A nitride layer 130, a blocking oxide layer 140, and a polysilicon gate conductive layer 150 are sequentially formed on the tunnel oxide layer 120.

The round edges E prevent the concentration of an electric field around the edges of the protrusion, thereby avoiding degradation of the tunnel oxide layer 120.

A silicide layer 155 is formed over the polysilicon gate conductive layer 150. The silicide layer 155 may be a cobalt silicide layer, a tungsten silicide layer, or a titanium silicide layer. The silicide layer 155 is formed by depositing a metal layer of cobalt, tungsten, or titanium on the polysilicon gate conductive layer 150 and performing a thermal treatment, such as rapid thermal annealing (RTA), on the metal layer. During RTA, the deposited metal layer reacts with silicon in the polysilicon gate conductive layer 150 to form the silicide layer 155. Portions of the metal layer that do not react with the silicon are cleaned and removed. The silicide layer 155 has a lower resistance than the polysilicon gate conductive layer 150 and thus increases an operating speed of devices.

As described above, an EEPROM according to the present invention comprises trench isolation regions that are recessed compared to an upper surface of a semiconductor substrate, thus increasing an area of an active region to range from the upper surface of the semiconductor substrate to the side of a protrusion between the isolation regions. Thus, an active channel region can be broadened without needing to change the size of a planar unit cell, thus increasing the efficiency of programming the memory and erasing information from the memory.

According to the present invention, the performance of a cell can be increased and the size of the memory cell can be reduced. Therefore, it is possible to manufacture a highly-integrated EEPROM having a higher packing density.

What is claimed is:

1. An non-volatile memory comprising:
   trench isolation regions formed in a semiconductor substrate having an upper surface lower than an upper surface of a semiconductor substrate;
   a tunnel insulating layer formed on the trench isolation regions and a protrusion of the semiconductor substrate between the trench isolation regions, the protrusion having rounded upper edges;
   a storage layer formed on the tunnel insulating layer;
   a blocking insulating layer formed on the storage layer; and
   a gate layer formed on the blocking insulating layer.

2. The non-volatile memory of claim 1, wherein portions of an interface between the gate layer and the blocking insulating layer above the isolation regions are lower than the upper surface of the semiconductor substrate.

3. The non-volatile memory of claim 1, wherein the upper edges of the protrusion of the semiconductor substrate protrude above the trench isolation regions.

4. The non-volatile memory of claim 1, wherein the trench isolation regions are formed in an inactive region of the semiconductor substrate.

5. The non-volatile memory of claim 1, further comprising a silicide layer formed on the gate layer, wherein the silicide layer has a lower resistance than the gate layer.

6. The non-volatile memory of claim 5, wherein the silicide layer is formed of one of a cobalt silicide, a tungsten silicide and a titanium silicide.

7. The non-volatile memory of claim 1, wherein an active area comprising a top and sidewalls of the protrusion is three-dimensional.

8. An non-volatile memory comprising a three-dimensional storage facility formed over trench isolation regions formed in a semiconductor substrate, the trench isolation regions having an upper surface lower than an upper surface of a semiconductor substrate, the upper surface of the semiconductor substrate being a protrusion of the semiconductor substrate between the trench isolation regions, the protrusion having rounded upper edges and angular lower edges.

9. The non-volatile memory of claim 8, wherein the three-dimensional storage facility comprises:

a tunnel insulating layer formed on the trench isolation regions and a protrusion of the semiconductor substrate between the trench isolation regions;

a storage layer formed on the tunnel insulating layer; and a blocking insulating layer formed on the storage layer.

10. The non-volatile memory of claim 9, further comprising a gate layer is formed on the blocking insulating layer.

11. The non-volatile memory of claim 10, further comprising a silicide layer formed over the gate layer.

12. The non-volatile memory of claim 10, wherein portions of an interface between the gate layer and the blocking insulating layer above the isolation regions are lower than the upper surface of the semiconductor substrate.

13. The non-volatile memory of claim 1, wherein the protrusion includes angular lower edges.

14. The non-volatile memory of claim 13, wherein the angular lower edges are formed between the trench isolation regions and the protrusion.

* * * * *